US008391504B1

(12) United States Patent
Abel et al.

(10) Patent No.: US 8,391,504 B1
(45) Date of Patent: Mar. 5, 2013

(54) METHOD AND SYSTEM FOR ARTIFICIAL REVERBERATION EMPLOYING DISPERSIVE DELAYS

(75) Inventors: Jonathan S. Abel, Menlo Park, CA (US); David P. Berners, San Jose, CA (US)

(73) Assignee: Universal Audio, Santa Cruz, CA (US)

(*) Notice: Subject to any disclaimer, the term of this patent is extended or adjusted under 35 U.S.C. 154(b) by 1405 days.

(21) Appl. No.: 12/006,448

(22) Filed: Dec. 31, 2007

Related U.S. Application Data

(60) Provisional application No. 60/882,724, filed on Dec. 29, 2006.

(51) Int. Cl.
*H03G 3/00* (2006.01)
*H04M 9/08* (2006.01)
*H04B 3/20* (2006.01)

(52) U.S. Cl. .......... 381/63; 381/61; 381/66; 379/406.06

(58) Field of Classification Search .................... 381/66, 381/63; 379/406.01–406.16
See application file for complete search history.

(56) References Cited

U.S. PATENT DOCUMENTS

| | | | | |
|---|---|---|---|---|
| 1,852,795 | A | 4/1932 | Wegel | |
| 2,230,836 | A | 2/1941 | Hammond | |
| 3,106,610 | A | 10/1963 | Young | |
| 3,136,853 | A * | 6/1964 | Bissonette et al. | 381/65 |
| 3,938,063 | A | 2/1976 | Meinema | |
| 4,438,525 | A | 3/1984 | Shibata | |
| 4,955,057 | A * | 9/1990 | Tominari | 381/63 |
| 5,614,686 | A * | 3/1997 | Van Duyne et al. | 84/622 |
| 6,580,796 | B1 * | 6/2003 | Kuroki | 381/63 |
| 2005/0089175 | A1 | 4/2005 | Van Tassel | |
| 2005/0152558 | A1 | 7/2005 | Van Tassel | |

* cited by examiner

*Primary Examiner* — Matthew Landau
*Assistant Examiner* — Khaja Ahmad
(74) *Attorney, Agent, or Firm* — Mark J. Danielson; Pillsbury Winthrop Shaw Pittman LLP

(57) ABSTRACT

The present invention relates to audio signal processing, and more particularly to methods and apparatuses for emulating and controlling various features of mechanical spring reverberation in a digital audio processing system. According to certain aspects of the invention, such an emulation is performed so as to enhance or alter the characteristics of a digitally stored or processed audio signal in substantially the same manner as a mechanical spring reverberation system. In one example embodiment, the propagation of energy through a mechanical spring is simulated using dispersive waveguides, wherein left-going and right-going waves are separately processed, and the effects of dispersion and attenuation commuted to the waveguide ends. According to additional aspects, many spring reverberators contain spring elements arranged in parallel, with no coupling between springs. Accordingly, in another embodiment of the present invention, such reverberators are modeled using a set of waveguide structures, arranged in parallel, and tuned to simulate the dispersion and attenuation of the torsional propagation modes of each of the individual spring elements. According to further aspects, reverberators occasionally have spring elements comprised of spring segments connected in series. Accordingly, in yet another embodiment of the invention, such arrangements are emulated using dispersive waveguide structures with scattering junctions between modeled spring segments. According to still other embodiments of the invention, both longitudinal and torsional waves are simulated so as to produce a widening over time of successive arrivals at the simulated pick-up, to thereby account for the difference in propagation speed between the torsional and longitudinal modes.

26 Claims, 18 Drawing Sheets

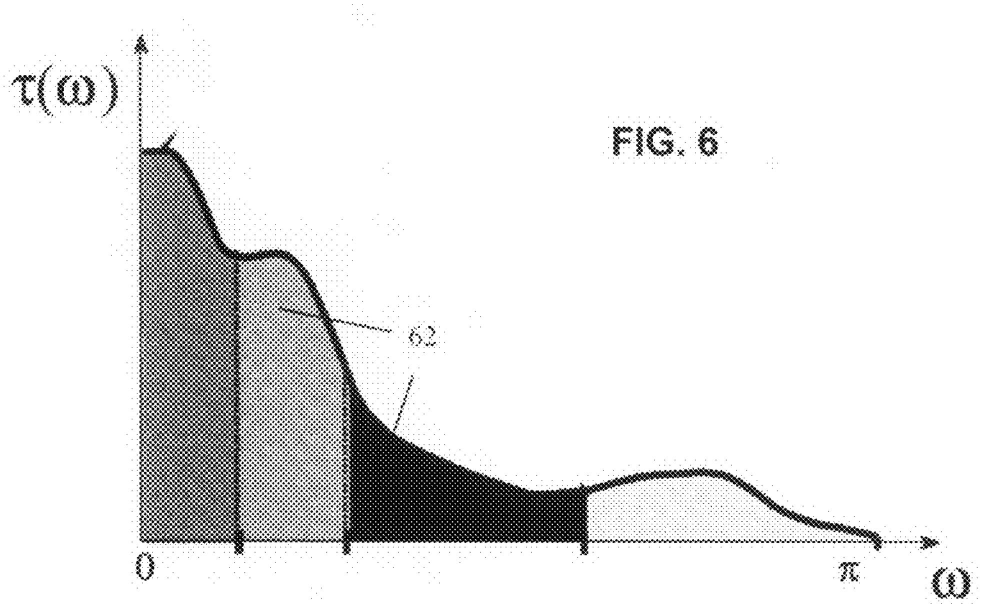
FIG. 6
FIG. 7
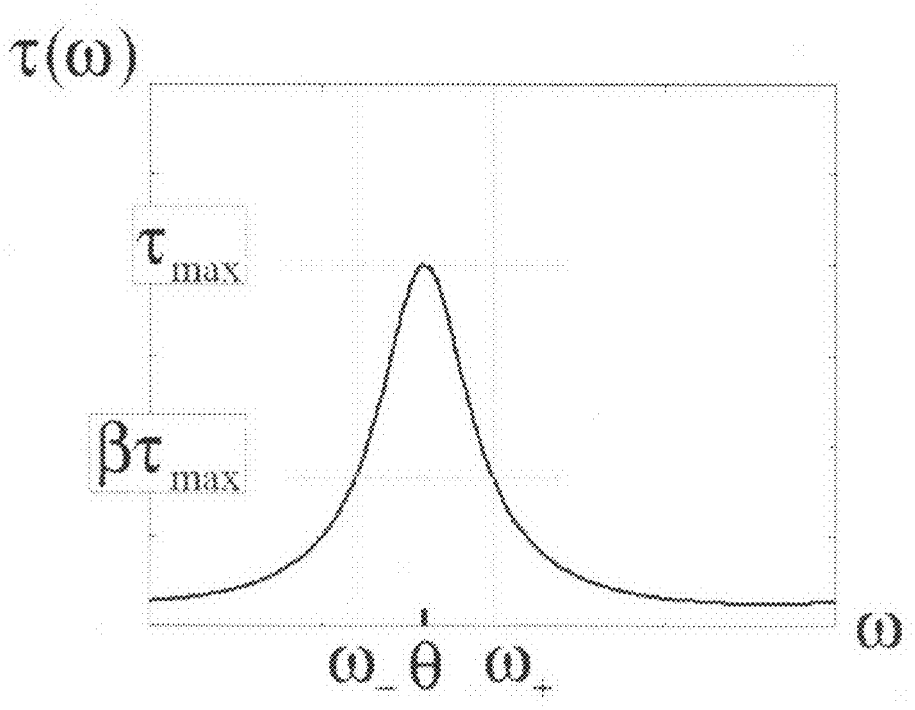

METHOD AND SYSTEM FOR ARTIFICIAL REVERBERATION EMPLOYING DISPERSIVE DELAYS

CROSS-REFERENCE TO RELATED APPLICATIONS

The present application claims priority from U.S. Prov. Appln. No. 60/882,724, filed Dec. 29, 2006, the contents of which are incorporated herein in their entirety.

FIELD OF THE INVENTION

The present invention pertains to the field of audio signal processing, and in particular to discrete-time artificial reverberation.

BACKGROUND OF THE INVENTION

Mechanical springs are used in a variety of audio applications. In typical applications, springs are driven by an input audio signal near one end. Depending upon the direction of the driving force, particular energy modes or combinations of modes will be excited on the spring. A delayed signal will then appear at the other end, with the amount of delay being determined by the wave propagation speed for the mode(s) excited. As shown in FIGS. 1A, 1B and 1C, helical springs support at least three transmission modes for mechanical vibrations at audio frequencies, including transverse, longitudinal and torsional modes, respectively.

In one early application dating back to the 1920s, springs were used to delay audio signals for telephone applications such as echo cancellation. See, e.g., R. L. Wegel, "Wave Transmission Device," U.S. Pat. No. 1,852,795, Apr. 5, 1932. Helical springs have also long been used for artificial reverberation (see, e.g., H. E. Meinema et al., "A New Reverberation Device for High Fidelity Systems," Journal of the Audio Engineering Society, vol. 9, no. 4, October, 1961 and U.S. Pat. No. 3,938,063) and are still a popular choice for guitar amplifer reverberators.

In the late 1930s, Hammond configured springs so that propagating waves would be reflected back and forth, creating a series of echoes reminiscent of reverberation. See Laurens Hammond, "Electrical Musical Instrument," U.S. Pat. No. 2,230,836, Feb. 4, 1941. Modern day mechanical spring reverberators take a very similar approach, often using two or three springs of different lengths in parallel to increase echo density, and driving the springs torsionally to minimize susceptibility to mechanical shock. See, e.g., Meinema et al., supra; Alan C. Young, "Artificial Reverberation Unit," U.S. Pat. No. 3,106,610, Oct. 8, 1963.

While the sound of a mechanical spring reverberator is desirable in a number of settings, its physical form limits its use. A digital emulation of a spring reverberator, on the other hand, would have many advantages over a physical unit, including repeatability and automation of control parameters. To be useful, such an emulation should effectively reproduce the sound of the hardware unit, and should be computationally efficient. However, problems exist that make such a useful emulation difficult to achieve.

For example, it could be argued that springs are approximately linear and time invariant at typical reverberator operating levels, and, as a result, may be characterized by their impulse responses. Accordingly, in one possible approach, a spring reverberator could be emulated by convolving an input signal with its measured impulse response. The difficulty is that such a convolution is expensive, both in computation and memory usage. There remains a need in the art, therefore, to develop a computationally efficient, accurate digital emulation of a spring reverberator.

Another drawback of a theoretical convolutional emulation of a spring reverberator is that it would be inflexible because different impulse responses would be required for each set of spring parameters desired, and it would be expensive to smoothly change from one parameter set to another. There remains a need in the art, therefore, to develop a discrete-time emulation of a spring reverberator which could be parameterized according to spring characteristics, which can be efficiently and smoothly changed.

In some musical genres, such as surf music, it is not unusual to rock, kick, or otherwise disturb the reverberation unit in time with certain musical events. These mechanical disturbances create distinctive sounds, and would preferably be included in a discrete-time spring reverberator emulation. These sounds could be recorded and played back like the sampling and playback of drums or other instruments in sampling synthesizers. However, such a system would require a lot of memory, and would not be easily adapted to varying spring or disturbance parameters. There remains a need in the art, therefore, to provide a spring reverberator which could efficiently and accurately produce the effect of a mechanical disturbance to the spring reverberator unit.

SUMMARY OF THE INVENTION

The present invention relates to audio signal processing, and more particularly to methods and apparatuses for emulating and controlling various features of mechanical spring reverberation in a digital audio processing system. According to certain aspects of the invention, such an emulation is performed so as to enhance or alter the characteristics of a digitally stored or processed audio signal in substantially the same manner as a mechanical spring reverberation system. In one example embodiment, the propagation of energy through a mechanical spring is simulated using dispersive waveguides, wherein left-going and right-going waves are separately processed, and the effects of dispersion and attenuation commuted to the waveguide ends. According to additional aspects, many spring reverberators contain spring elements arranged in parallel, with no coupling between springs. Accordingly, in another embodiment of the present invention, such reverberators are modeled using a set of waveguide structures, arranged in parallel, and tuned to simulate the dispersion and attenuation of the torsional propagation modes of each of the individual spring elements. According to further aspects, reverberators occasionally have spring elements comprised of spring segments connected in series. Accordingly, in yet another embodiment of the invention, such arrangements are emulated using dispersive waveguide structures with scattering junctions between modeled spring segments. According to still other embodiments of the invention, both longitudinal and torsional waves are simulated so as to produce a widening over time of successive arrivals at the simulated pick-up, to thereby account for the difference in propagation speed between the torsional and longitudinal modes. According to yet further embodiments of the invention, transverse, longitudinal and torsional waves are simulated using coupled waveguides. The transverse and longitudinal waves may be clipped according to the dimensions of the spring enclosure, which limits the amplitude of the transverse waves, and the adjacent coil spacing, limiting the longitudinal wave amplitude. In yet another embodiment, the dispersion characteristics of a spring element are modified to create a different reverberation. According to additional aspects of the invention, interesting sounding reverberators can be made by using a dispersion characteristic which delays low frequencies more than high ones, or by changing the dispersion characteristics over time.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 6 is a graph illustrating one example of how a dispersion filter for using in a waveguide model can be estimated using a plurality of allpass filter sections according to certain aspects of the invention;

FIG. 7 is a graph illustrating certain parameters of poles for allpass filter sections such as those used in an estimated dispersion filter;

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the present inventors recognize various aspects and characteristics of spring reverberation mechanisms, and provide methods and apparatuses to accurately and efficiently emulate them in a digital audio processing system.

For example, the present inventors note that many modern spring reverberators (e.g. Accutronics spring reverberators from Sound Enhancement Products, Inc. of Cary, Ill.) consist of several (usually two or three) independent spring elements, operating in parallel. Swept sinusoid measurements on a variety of such reverberators show them to be approximately linear and time invariant at typical operating levels. The present inventors further recognize that there is typically little, if any, interaction between spring elements in such types of reverberators, and so the elements may thus be analyzed and modeled separately. Models of the individual elements can thus be created based solely on impulse-response data, because of the linearity of the system at typical operating levels.

Figure 1:
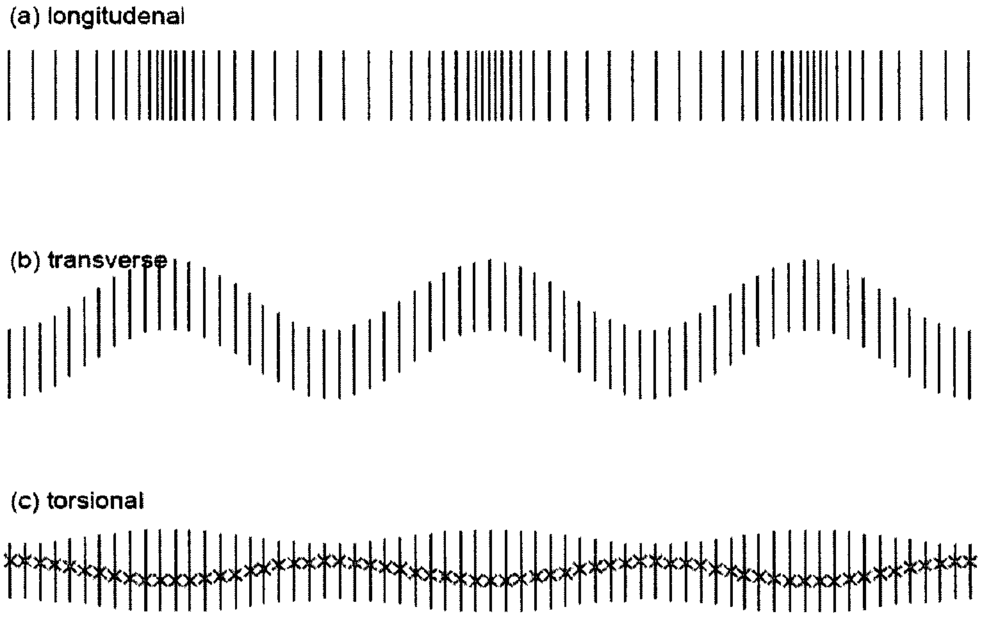
FIG. 1 (PRIOR ART)
FIGS. 1A to 1C illustrate spring propagation modes: Transverse (a), longitudinal (b) and torsional (c)
Figure 2:
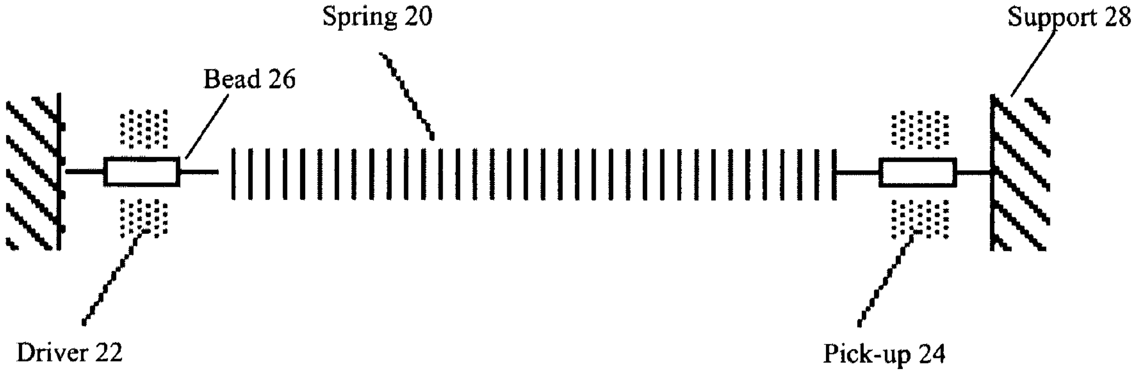
FIG. 2 illustrates a typical helical spring element.

More particularly, as shown in FIG. 2, the individual spring elements 20 studied in this manner are stretched between two supports 28, and have magnetic beads 26 attached to their ends. The bead 26 at the driver 22 end is rotated according to the input, and the resulting torsional wave propagates along the length of the spring. When the wave reaches the pick-up 24 end of the spring, it will twist against the rigid support 28 and be reflected back along the spring toward the driver 22. For a transient input, the wave will be further reflected back and forth between driver 22 and pick-up 24 until all energy is expended within the spring.

Pick-up 24 detecting the bead rotation (e.g. torsional mode response) will therefore see the initial wave and then a series of echoes in response to an impulse input. Moreover, since the driver and pick-up are at opposite ends of the spring, echo arrivals are expected at odd integer multiples of the travel time between driver and pick-up. Successive echoes will be attenuated, i.e. reduced in amplitude, as signal energy is lost to damping with each end reflection and to heat as the coils wind and unwind with the passing wave.

Figure 3:
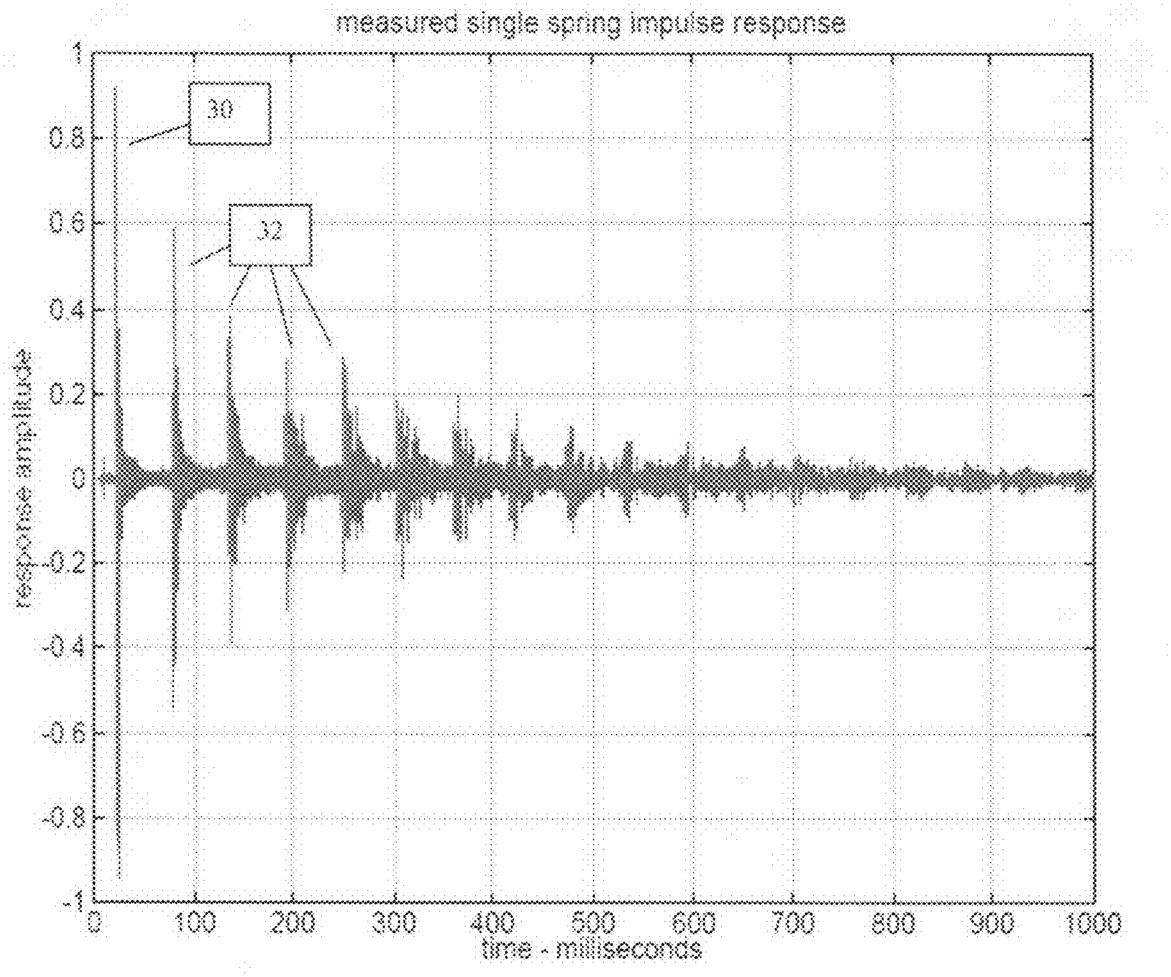
FIG. 3 is a time-amplitude graph showing an example of a measured spring element impulse response.

FIG. 3 illustrates impulse response measurements of an individual spring element such as that shown in FIG. 2 (e.g. torsional mode response as detected by pick-up 24). As can be seen in FIG. 2, the impulse response includes a series of echoes 32 that are successively attenuated in amplitude and having the expected time spacing between them corresponding to twice the travel time between driver and pick-up. However, as further seen in FIG. 3, the individual echoes are also noticeably smeared or dispersed over time, and this feature is further analyzed as will now be explained.

Figure 4:
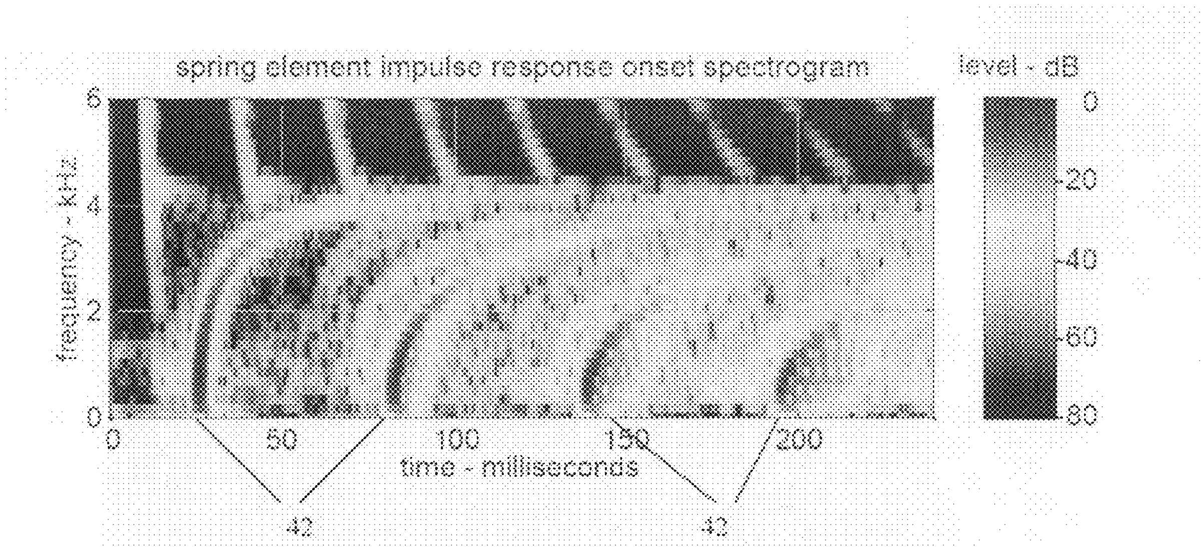
FIG. 4 is a graph showing an example of a measured spring element impulse response onset spectrogram.

FIG. 4 is a spectrogram showing the frequency-dependent energy of the first few arrivals 42 at the pick up 24. From this FIG. 4 it can be seen that low-frequency portions of these signals propagate faster than high-frequency portions, resulting in frequency-related dispersive propagation. More particularly, as can be seen in FIG. 4, the spacing of successive arrivals 42 at the same given low frequency (e.g. near 0 kHz) will be earlier and shorter in time than the spacing of the same arrivals 42 at a different higher frequency (e.g. above 2 kHz).

Several other features of the spring-element spectrogram are noted by the inventors. For example, little energy propagates above a cutoff frequency (around 4 kHz for the spring analyzed in FIG. 4, and those in many other commercially available spring reverberators), contributing to the spring's equalization. This appears to be related to the wavelength of signals traveling on the spring. Torsional waves spanning just a few coils take on a very small group velocity.

Furthermore, the inventors note that above the cutoff frequency, there is another propagation mode having a speed several times that of the mode propagating below the cutoff. It appears in the output with fairly low amplitude, and is weakly dispersive, propagating high frequencies faster than low frequencies. Since it shares the cutoff frequency with the main torsional mode, the inventors surmise that this mode could be a torsional bending mode of the spring.

According to aspects of the invention, each spring element in a spring reverberator is modeled as one or more interconnected waveguide sections, with each section having filters to account for the above-identified delay, attenuation and dispersion characteristics. As shown above, spring impulse response measurements suggest that the torsional mode used by modern springs is strongly dispersive, and that little energy propagates above a cutoff frequency. An approach taken here, therefore, is to simulate the propagation using dispersive waveguides, wherein left-going and right-going waves are separately processed, and the effects of dispersion and attenuation commuted to the waveguide ends.

Figure 5:
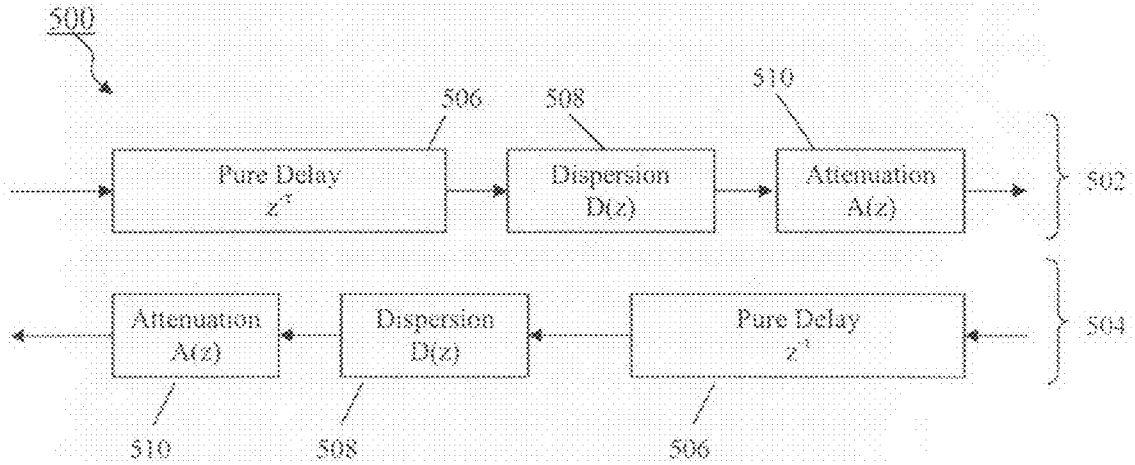
FIG. 5 is a block diagrams illustrating a model of a spring element as a waveguide section.

For example, as shown in the embodiment of FIG. 5, a spring segment is modeled as a waveguide 500 having first and second sections 502 and 504 respectively propagating left-going and right-going torsional waves. Sections 502 and 504 each include a pure time delay $z^{-\tau}$ 506, a propagation dispersion filter D(z) 508 and a propagation attenuation filter A(z) 510. In general, pure delay 506 introduces a frequency-independent time delay corresponding to the at most the shortest travel time of any portion of the wave through the length of the spring segment, dispersion filter D(z) 508 introduces frequency-dependent dispersive delay and attenuation filter A(z) 510 introduces frequency-dependent attenuation. In the example shown in FIG. 5, delays 506 and filters 508 and 510 are the same in each section 502, but this is not necessary. However, the filters and delays are tuned to emulate the spring impulse response characteristics as analyzed above.

More particularly, according to one aspect of the invention, the dispersion filter D(z) 508 is estimated by examining successive arrivals in the measured spring element impulse response such as that illustrated in FIGS. 3 and 4. Then, an allpass filter is designed to fit to the measured time delay as a function of frequency. Accordingly, in this approach, the goal is to design an allpass filter D(z) to match a desired frequency-dependent delay, $\delta(\omega)$ as determined from the measured impulse response of the spring segment to be emulated.

In one example embodiment, described in more detail in J. S. Abel and J. O. Smith, "Robust Design of Very High-Order Dispersive Allpass Filters," Proc. of the 9th Int. Conference on Digital Audio Effects (DAF '06), Montreal, Canada, Sep. 18-20, 2006, the contents of which are incorporated herein by reference, the allpass filter D(z) 508 is constructed from a plurality (complex) first-order allpass filter sections, taking advantage of the fact that each section has a $2\pi$ integrated delay, and a delay peak which may be arbitrarily located and scaled. The overall filter is formed by dividing the desired group delay $\delta(\omega)$ (as determined from the measured impulse response of the spring element to be emulated) into frequency bands 62, each having area $2\pi$, as shown in FIG. 6, and then modeling each delay band with its own allpass filter section.

More particularly, in a first step, a constant delay is added to the desired frequency-dependent delay $\delta(\omega)$ so that it integrates to a desired multiple N of $2\pi$, where N is the desired allpass order. In a next step, starting at DC, the measured group delay $\delta(\omega)$ is divided into $2\pi$-area frequency bands, as illustrated in FIG. 6. For each band 62, a first-order (complex) allpass filter section $G_n(z)$ is fitted in the manner to be described below. Then, all of the first-order sections $G_n(z)$ are cascaded to form the overall allpass filter, $$D(z)=G_1(z)*G_2(z)* \ldots *G_n(z)$$

The pole location for each band is found as follows. The idea is to have the pole-zero pair delay $\tau(\omega)$ approximate the group delay $\delta(\omega)$ in that band, and be small outside the band. The pole $\rho$ frequency is taken to be the band midpoint, $\theta=(\omega_+ + \omega_-)/2$, where the frequencies $\omega_\pm$ denote the left and right band edges. The pole $\rho$ radius is chosen so that the group delay at either band edge is a fraction of the peak group delay, as illustrated in FIG. 7. This controls the width of the group delay peak in each band, and determines a tradeoff between smoothness of fit to the desired group delay and the maximum "slew rate" of the allpass group delay (i.e., its ability to follow small-bandwidth features in the desired group delay). Setting $\tau(\omega_\pm)=\beta \max \tau(\omega)$, we find $\rho(\beta)=\eta-[\eta^2-1]^{1/2}$, where $\eta=(1-\beta \cos \Delta)/(1-\beta)$ and $\Delta=\omega_+ - \omega_-)/2$.

Note that in the second step of the design procedure above, the initial band edge was set to zero. As the group delay $\delta(\omega)$ is even in frequency for real filters, this choice leads to first-order allpass sections appearing as complex conjugate pairs which may be combined to form biquads having real coefficients. Allpass filters with real coefficients also result by choosing the first band to be centered on DC. This can be done by setting the first band edge frequency to that at which the integral of $\delta(\omega)$ from DC is $\pi$. In this case, there will be two first-order allpass sections with real poles (one at DC and one at the Nyquist limit), and the rest will appear as complex conjugate pairs.

The list of band edges encodes all relevant delay information, with the band filters separately computed from their band-edge frequencies and a user-supplied $\beta$. As a result, the design method is very efficient, requiring little more than an evaluation of $\rho(\beta)$ and $\theta$ as described above per designed biquadradatic filter section (i.e. biquad). It is also numerically robust, with numeric requirements nearly independent of model order.

A fair number of bands (e.g. around 20) is often needed to capture the behavior of the desired delay, and in this case, the bands will be everywhere sufficiently narrow such that $\rho(\beta)$ may be approximated by $\rho(\beta)\approx 1-(\beta/1-\beta)^{1/2}\Delta$, $\Delta \ll 1$. The overlap parameter $\beta$ is generally supplied by the user and independent of frequency, so that the root $[\beta/(1-\beta)]^{1/2}$ may be pre-computed. Under these conditions, the filter design is less costly than its implementation, and real-time manipulation of the frequency-dependent delay is inexpensive. Furthermore, it is well known how to interpolate coefficients of stable biquad sections so as to obtain meaningful stable intermediate filters.

Returning to FIG. 5, filter A(z) 510 can be estimated by fitting a filter to the measured frequency-dependent attenuation. For example, energy time-plots of the first N arrivals of the impulse response can be measured from the spring element to be emulated. Windowed Fourier transforms of these individual reflections can be performed to provide a plurality N of spectral plots of energy as a function of frequency. By dividing the transform magnitudes of successive arrivals, the filtering impressed on the signal during one round trip through the spring can be estimated. The N spectra therefore can be used to produce N−1 spectral ratios, and a smoothed filter can be designed to fit to them using many techniques well known in the art of digital filter design. This smoothed filter can then be inserted into the waveguide model as A(z) 510. Since there are two instances of filter A(z) in one round trip through the spring, the filter should be fit to the square-root of the spectral ratios.

Many spring reverberators contain spring elements arranged in parallel, with no coupling between spring elements. In a preferred embodiment of the present invention, such reverberators are modeled using a set of waveguide structures such as those shown in FIG. 5, arranged in parallel, and tuned to simulate characteristics of each of the individual spring elements.

It should be noted that spring elements are terminated on both ends, so that the spring element models further include terminating reflection filters. These can be designed separately, or combined with the spring segment to account for the overall attenuation seen in successive arrivals. Moreover, if the spring terminations are relatively stiff (i.e. lossless), the termination reflection filters will tend toward allpass filters.

Many spring reverberators have spring elements comprised of spring segments connected in series. Accordingly, in another embodiment of the invention such as that shown in FIG. 8, such arrangements are emulated using dispersive waveguide structures 800 with scattering junctions 802 between modeled spring segments. In this example, a spring element having a set of counter-wound spring segments is modeled with scattering junctions occurring at the mechanical connection between each of the counter-wound spring segments. Scattering junctions can also be added to model reflections caused by localized irregularities in the springs, including changes in cross-sectional area, stiffness or nicks/scratches/cuts. Waveguide sections 804 can be implemented by the bi-directional series connection of pure delay, dispersion filtering, and attenuation filtering described above in connection with FIG. 5.

Figure 8:
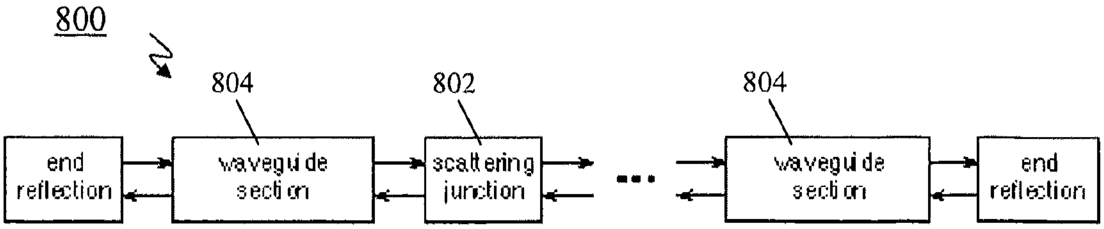
FIG. 8 is a block diagram illustrating a how a spring reverberator can be modeled using a set of waveguide sections, connected via scattering junctions, and terminated at the spring ends, according to certain aspects of the invention.
Figure 9:
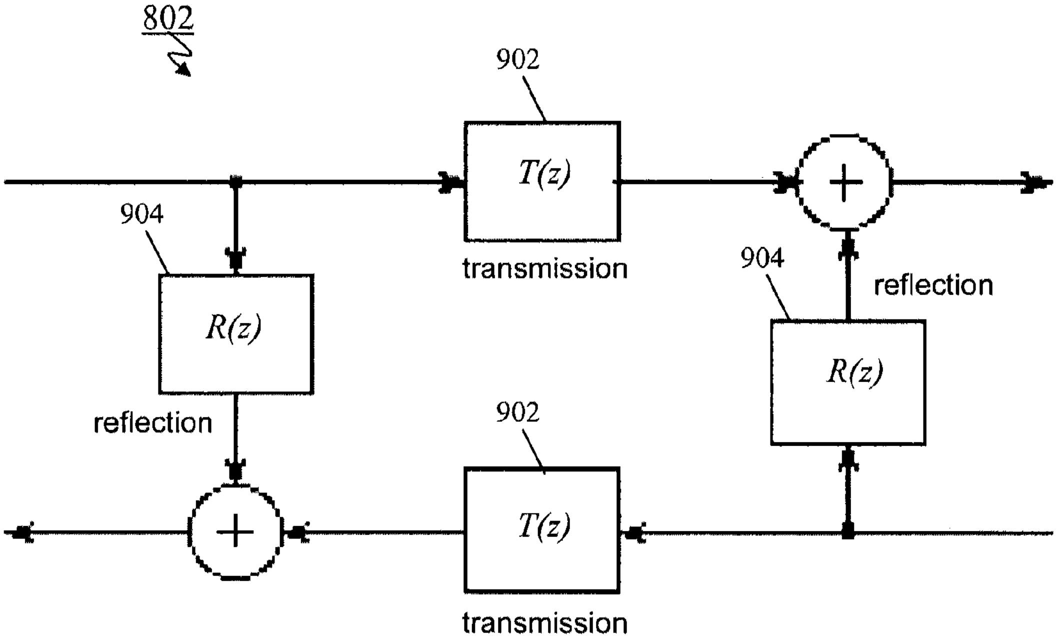
FIG. 9 is a block diagram illustrating an example model of a scattering junction according to aspects of the invention.

FIG. 9 shows one example implementation of a scattering junction 802 in more detail. As shown in FIG. 9, it includes a pair of transmission filters T(z) 902 and a pair of reflection filters R(z) 904. Since losses within the waveguide have already been accounted for by the filters within the waveguides 804 of FIG. 8, the scattering junctions are typically lossless, i.e., R(z)+T(z)=1 at every frequency.

The model of FIG. 8 can be extended to account for the above-cutoff propagation mode mentioned above and seen in FIG. 4. This could be accomplished by adding a second, parallel waveguide, with a different (shortened) delay length corresponding to the increased group velocity of the mode. However, because of the low amplitudes associated with this mode, it may be neglected.

For those types of spring reverberation units employing torsional or longitudinal modes, the present inventors recognize that torsional waves will wind the spring, which changes the coil spacing, and thereby creates longitudinal waves. Longitudinal and torsional waves propagate at slightly different speeds, and couple to each other continuously along the spring.

In a single length of spring such as that analyzed in FIG. 4, the impulse response spectrogram has arrivals which, at any given frequency, become increasingly smeared over time. Eventually the arrivals are sufficiently smeared that they give the impulse response a noiselike 'wash' rather than the repeated chirp heard during the impulse response onset. The present inventors recognize that additional emulation accuracy could be achieved by correctly accounting for this smearing thought to be caused by the coupling between torsional and longitudinal transmission modes.

Figures 10A, 10B, 10C:
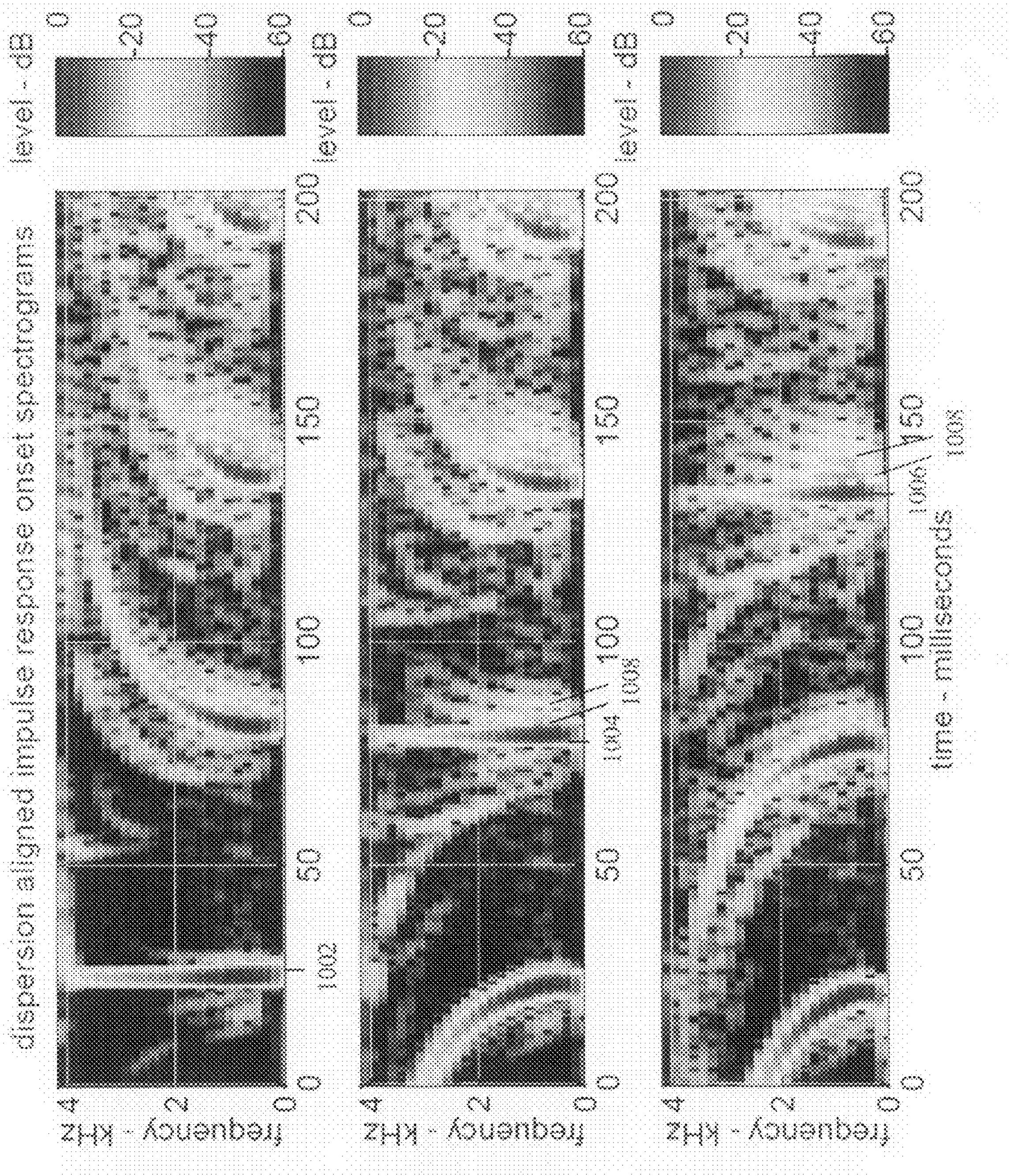
FIGS. 10(*a*) to 10(*c*) are graphs illustrating an example of dispersion aligned measured spring impulse response onset spectrograms.
Figure 11:
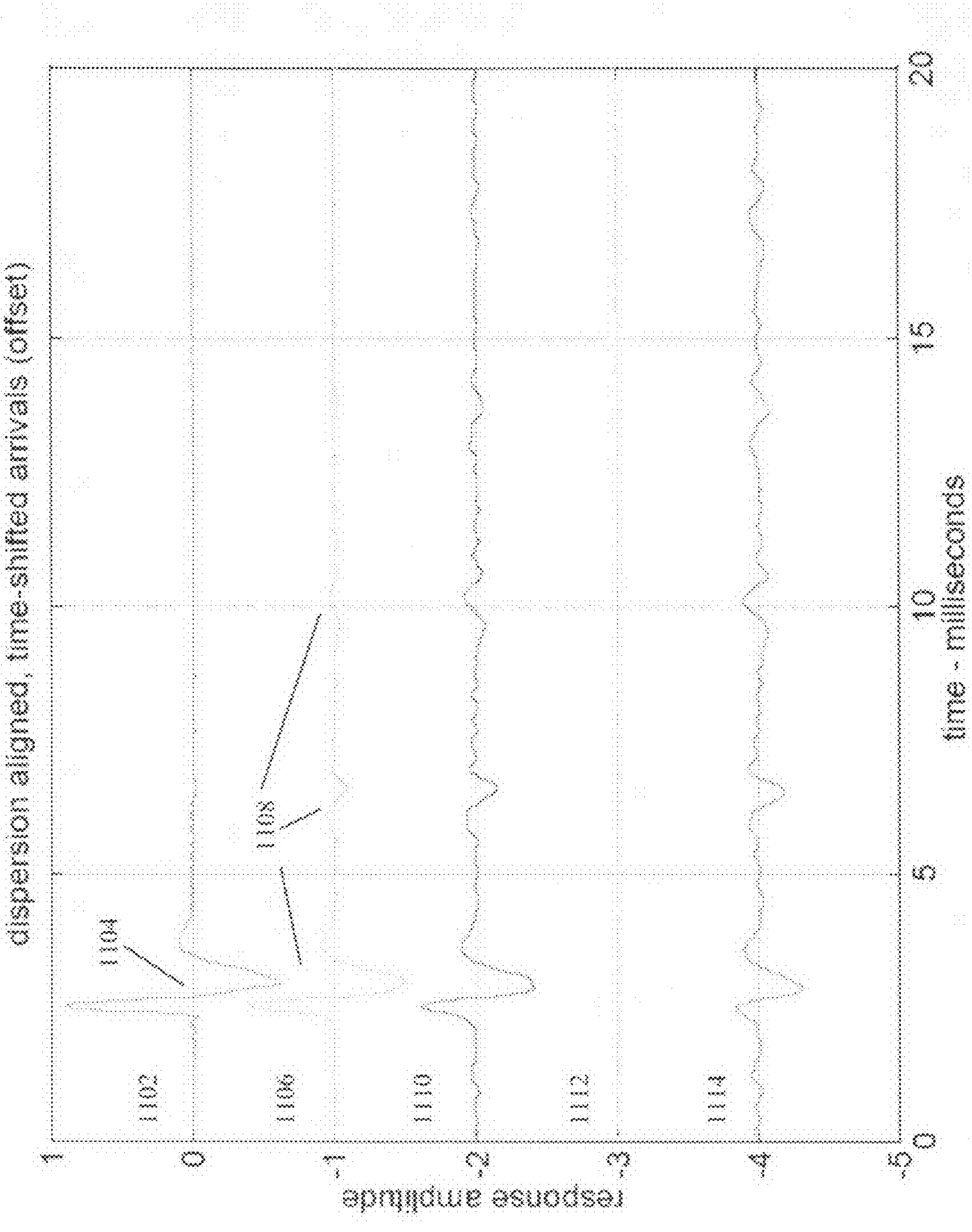
FIG. 11 is a graph illustrating an example of measured dispersion aligned, time-shifted arrivals corresponding to FIGS. 10(*a*) to 10(*c*)

More particularly, FIG. 10(*a*) shows the spectrogram of FIG. 4, with the high frequencies advanced so as to eliminate dispersion from the first arrival 1002 (and corresponding to the first arrival 30 in FIG. 3). FIGS. 10(*b*) and (*c*) are similarly processed to align arriving energy for the second and third arrivals 1004 and 1006, respectively. The corresponding arrival waveforms are shown in FIG. 11. The first arrival, which results from one traversal of the spring, yields a single pulse 1104, as seen in the top waveform 1102 in FIG. 11. The second arrival waveform 1106 shown in FIG. 11, and corresponding to three traversals of the spring, has three regularly-shaped pulses 1108, and so on for the subsequent arrival waveforms 1110, 1112, 1114, etc. Noting that the pulse spacing is consistent with the difference between the torsional and longitudinal propagation speeds, the present inventors have surmised from the observed arrival pattern that the torsional and longitudinal modes couple into each other at the spring ends.

Further analysis of a spring impulse response reveals that two echoes 1008 appear for each length of spring traveled. In particular, the torsional mode pick-up will see a sequence of arrivals having 1, 3, 5, 7, etc. equally spaced echoes 1008, creating a sort of 'wash' in the impulse response tail. As can be seen in FIG. 10, the spacing of the echoes making up each arrival group is about a tenth of that of the arrival group spacing, consistent with the difference in propagation speed between the torsional and longitudinal modes.

In alternative embodiments of the invention, both longitudinal and torsional waves are simulated so as to produce a widening over time of successive arrivals at the simulated pick-up as recognized by the inventors. For example, with the appropriate delay, dispersion and attenuation, the model of FIG. 5 can be used to synthesize the longitudinal mode. Coupling between the longitudinal modes can be done, for instance, using coupling filters.

Figure 12:
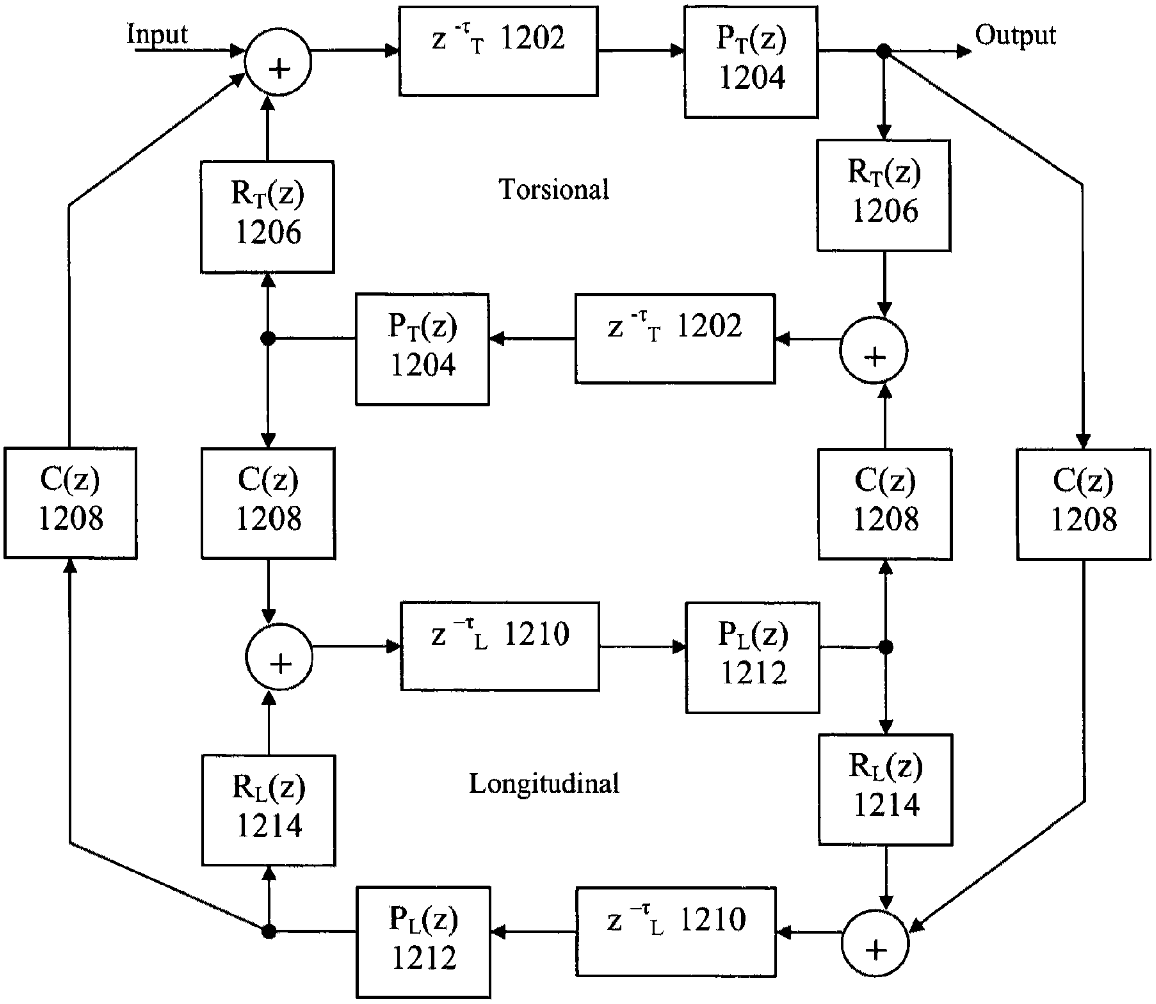
FIG. 12 is a block diagram illustrating an example of how a spring reverberator can be modeled to account for coupling between more than one propagation mode according to aspects of the invention.

More particularly, an example model that includes both torsional modes is shown in FIG. 12. Here, the torsional and longitudinal waves are separately computed, and coupled through coupling filters at the waveguide element ends. The input is applied to the input torsional waveguide section, and the output is taken from the output torsional waveguide section. Delays 1202 and 1210 account for pure time delays in the torsional and longitudinal modes, respectively, filters 1204 and 1212 account for both attenuation and dispersion in the torsional and longitudinal modes, respectively, and filters 1206 and 1214 account for torsional and longitudinal mode reflections, respectively. These filters can be designed as described in the previous embodiments. Coupling filters 1208 that account for the coupling between modes can be designed as will be described in more detail below. It should be noted that although FIG. 12 shows each of these filters 1208 to be the same, it is possible that some or all of them can have different individual characteristics.

Figure 13:
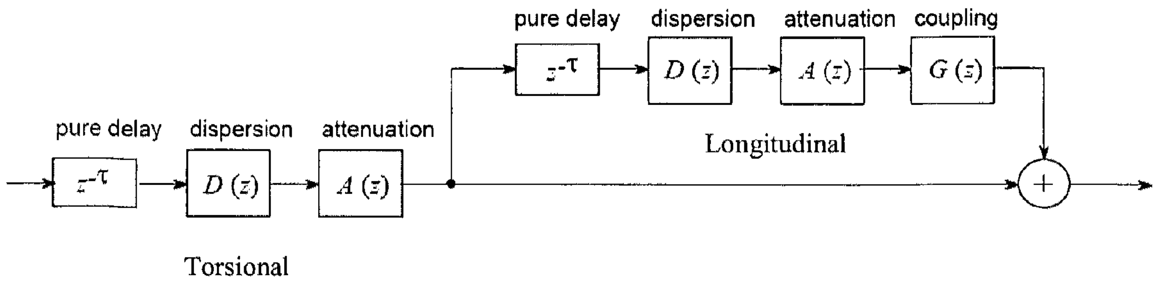
FIG. 13 is a block diagram illustrating a computationally efficient version of the model in FIG. 12.

A computationally efficient approximation to the model of FIG. 12 is to use the model of FIG. 8, with the left and right propagation sections of the waveguide sections for torsional and longitudinal modes each replaced with a single propagation section. The propagation sections for each mode are then joined in series as shown in FIG. 13. The idea is that the extra delayed path will generate the additional echoes with each traversal of the spring section as observed from FIGS. 10 and 11.

The delays, dispersion and attenuation filters can be designed as described in previous embodiments. However, it should be noted that, in this configuration, the delay $\tau$ and the dispersion filter D(z) in the longitudinal section should be adjusted to be a function of the difference between the delays and dispersions in the longitudinal and torsional modes due to the series connection with the delay and dispersion from the torsional section.

Figure 14A:
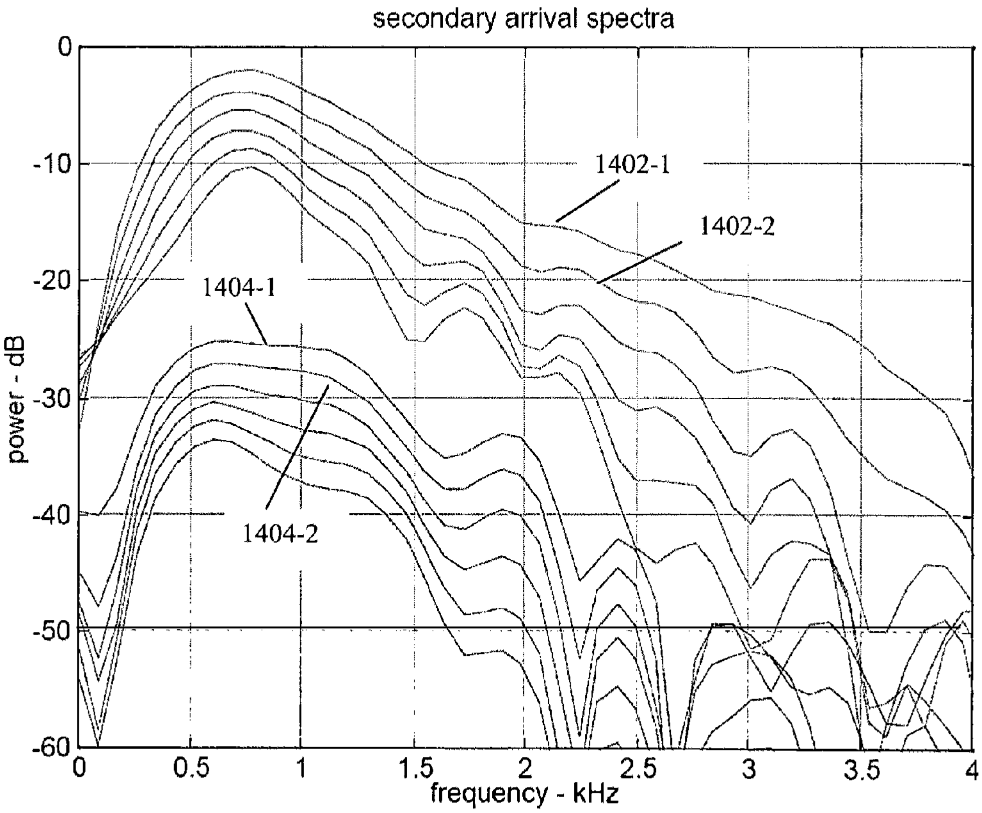
FIGS. 14(*a*) and (*b*) are graphs illustrating one example of how to estimate a coupling filter between transmission modes using secondary arrival spectra according to aspects of the invention.
Figure 14B:
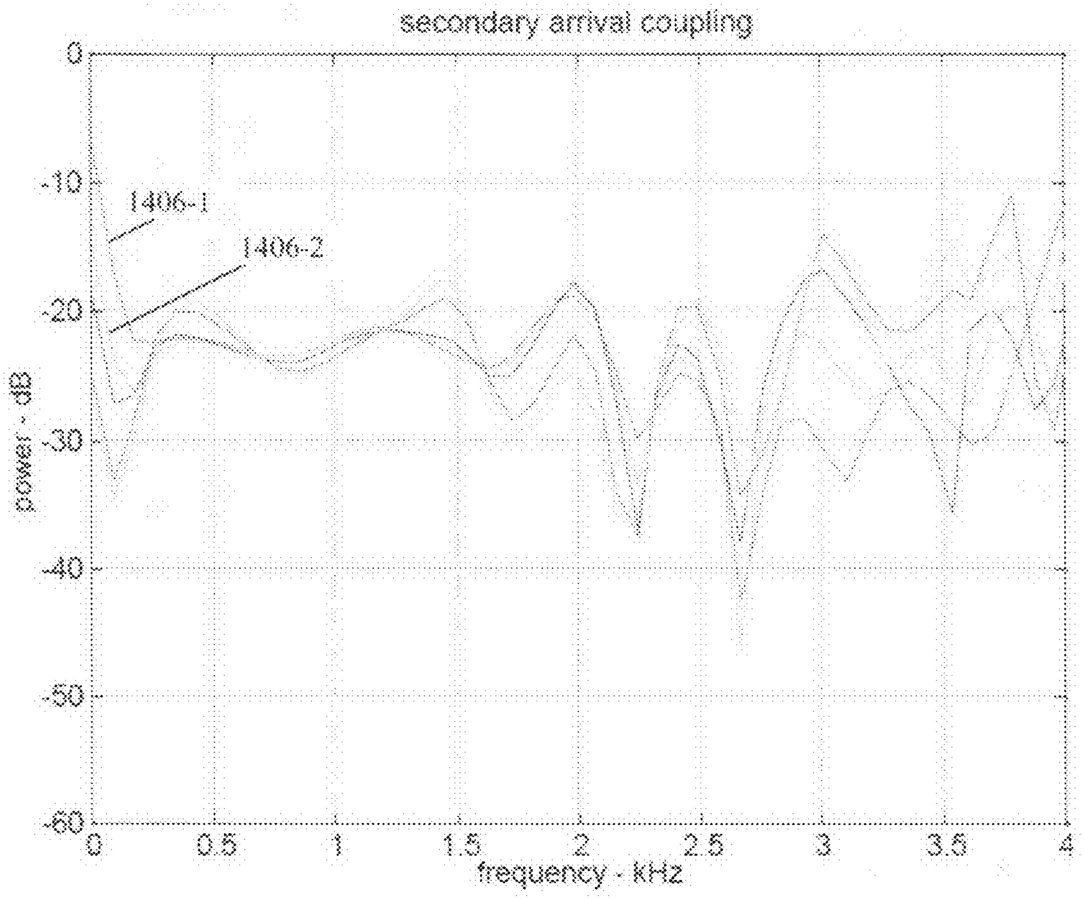

By appropriately tuning the coupling filter G(z), the desired echo frequency content may be approximated. This can be done, as will now be described in connection with FIGS. 14(*a*) and 14(*b*). More particularly, the top group of curves in FIG. 14(*a*) shows the power spectra 1402-1 and 1402-2 of the first pulses in the waveforms 1102 and 1106 shown in FIG. 11, respectively, as well as the power spectra of the first pulses in the other waveforms 1110, 1112, 1114. The bottom group of curves in FIG. 14(*a*) shows the power spectra 1404-1 and 1404-2 of the first echoes 1008 (and the second two echoes 1108 of FIG. 11) associated with those pulses as shown in FIGS. 10(*b*) and 10(*c*), as well as the echo power spectra for the other waveforms. The inventors recognize that these echoes result from the coupling between longitudinal and torsional modes.

Accordingly, filter G(z) may be estimated by forming the ratios 1406 of the respective spectra 1404 to spectra 1402, and then fitting a filter to a smoothed version of those respective ratios. This is shown in more detail in FIG. 14(*b*).

It should be noted that similar processing can be performed to estimate coupling of transverse modes. For example, by placing a waveguide structure propagating a transverse mode in parallel with ones propagating torsional and longitudinal modes, the sound resulting from a mechanical disturbance applied to the spring may be emulated. As in FIG. 13, the torsional and longitudinal modes are coupled together, and the transverse mode is further coupled with the longitudinal mode. Mechanical disturbances would drive the transverse mode, which would in turn couple to the longitudinal and torsional modes. Note that the transverse waves may be limited in value to reflect the excursion limits of the spring tank being emulated.

When a mechanical disturbance is applied to the reverberation unit, waves in a number of propagation modes are created. Often a fair amount of transverse mode energy will result. The transverse mode will couple into the longitudinal mode as the springs stretch and compress, and the longitudinal mode will couple into the torsional mode as the stretching and compression causes the coils to wind and unwind. The torsional energy is seen at the pick-up, and is heard as a sputtery series of chirps, repeating with the period of the transverse wave. In a preferred embodiment, transverse, longitudinal and torsional waves are simulated using coupled waveguides. The transverse and longitudinal waves may be clipped according to the dimensions of the spring enclosure, which limits the amplitude of the transverse waves, and the adjacent coil spacing, limiting the longitudinal wave amplitude.

The above and other aspects of the invention will now be further described in connection with an illustrative example.

Figure 15:
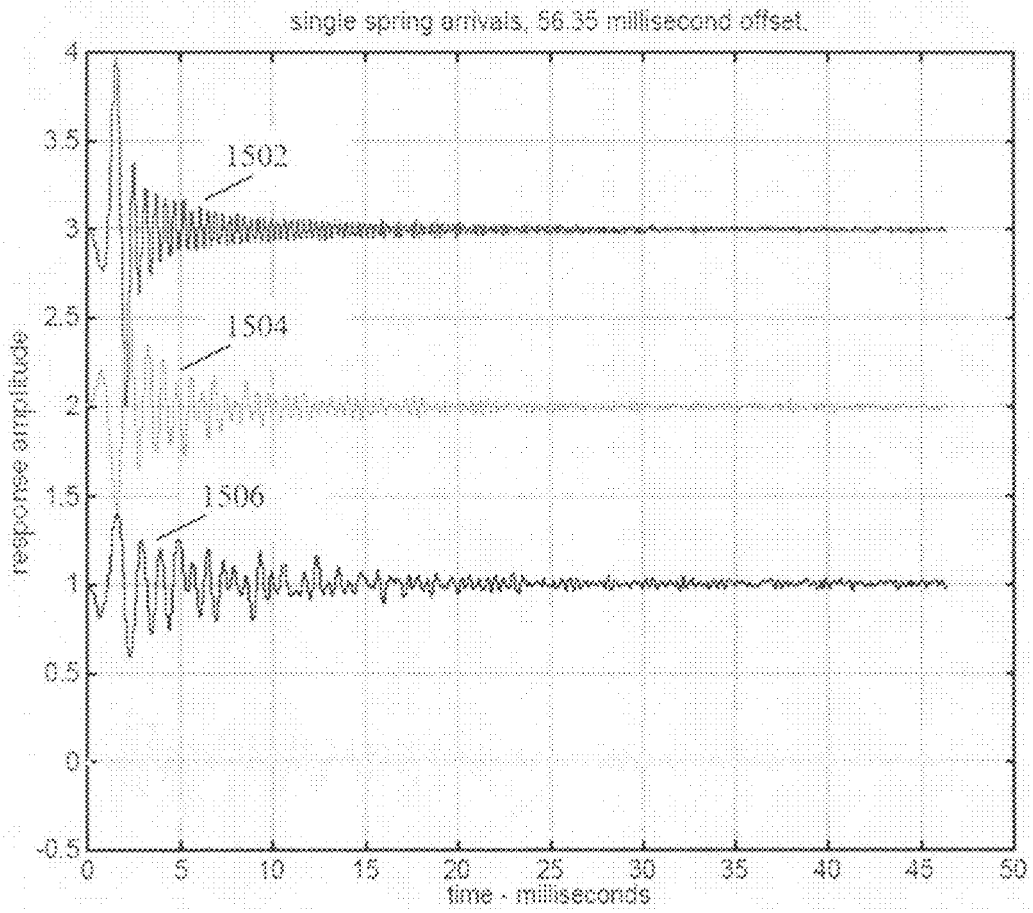
FIGS. 15-19 are graphs providing illustrative examples of how an Accutronics Type 8 spring reverberator can be measured and modeled according to aspects of the invention.

More particularly, FIG. 15 shows time-plots of the first reflections of the impulse response measured from a spring element of an Accutronics Type 8 reverberator (available from Sound Enhancement Products, Inc. of Cary, Ill.). As can be seen, the energy is localized near t=0 in the top trace 1502, while the lower traces 1504, 1506, etc. have impulse responses with a longer duration. The total amount of energy in the lower plots is also reduced. As described above, round-trip filtering due to losses in the spring and scattering accounts for the level differences between the traces of FIG. 15. Dispersion in the spring causes the lengthening of successive reflections. Frequency-dependent losses also change the relative shapes of the reflections.

Figure 16:
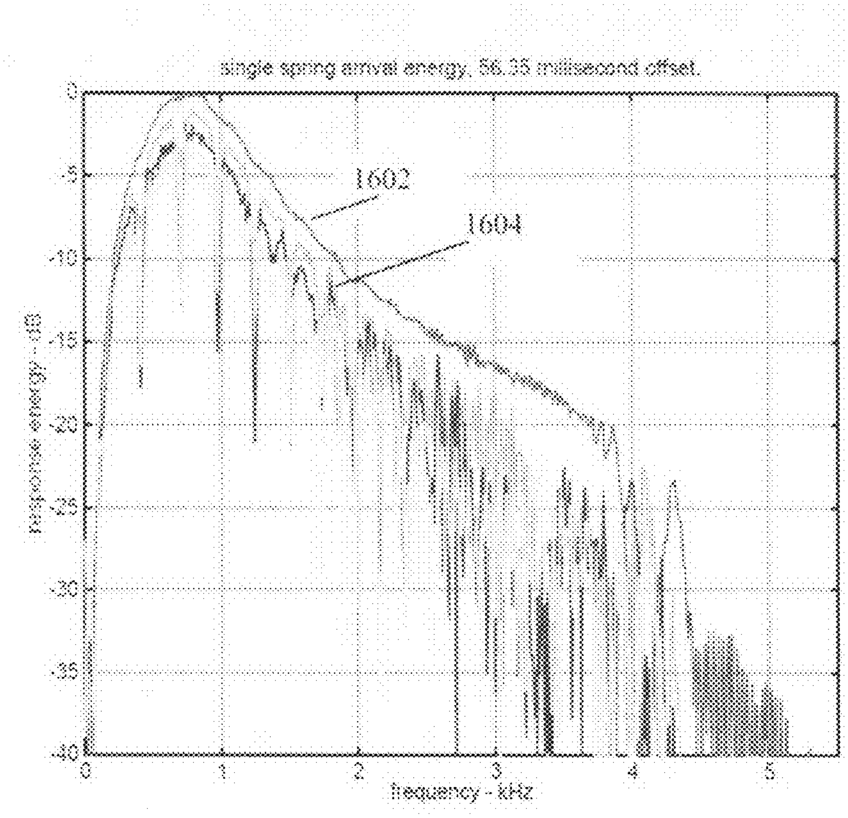
Figure 17:
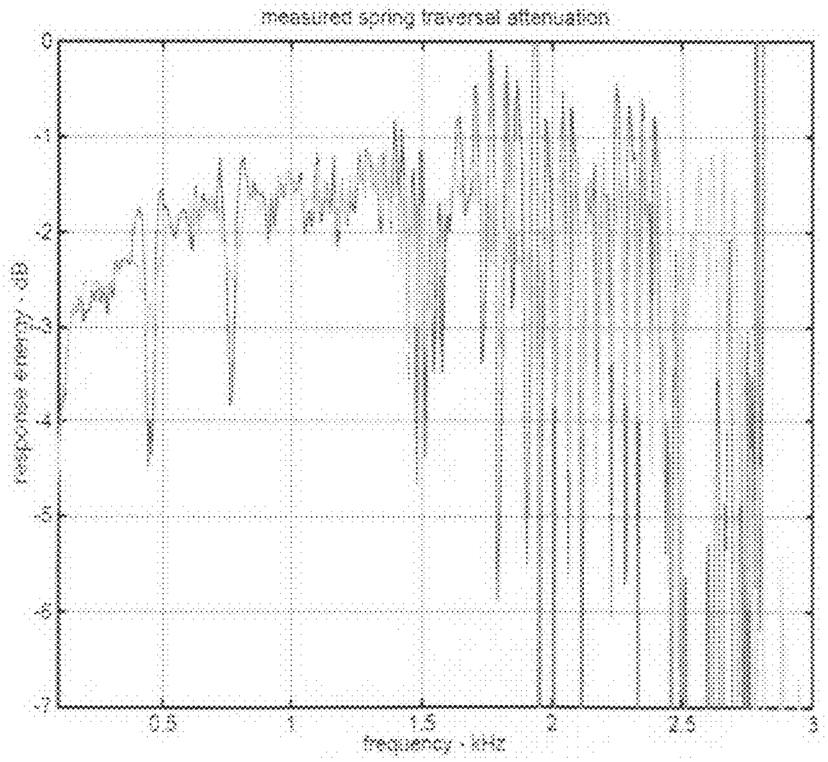

FIG. 16 shows magnitude spectral plots 1602, 1604, etc. for the successive reflections 1502, 1504, 1506, etc. Doing a pointwise division between successive spectral transforms in FIG. 16 results in the transform magnitude ratio plots of FIG. 17. As described above, by dividing the transform magnitudes of successive reflections, the filtering impressed on the signal during one round trip through the spring can be calculated. The N spectra of FIG. 16 therefore can be used to produce N−1 spectral ratios of FIG. 17. A smoothed filter, designed to fit the data of FIG. 17, can be used to approximate the attenuation filter A(z) in the waveguide model. Since there are two instances of filter A(z) in one round trip through the spring, the filter should be fit to the square-root of the spectral ratios of FIG. 17.

Figure 18:
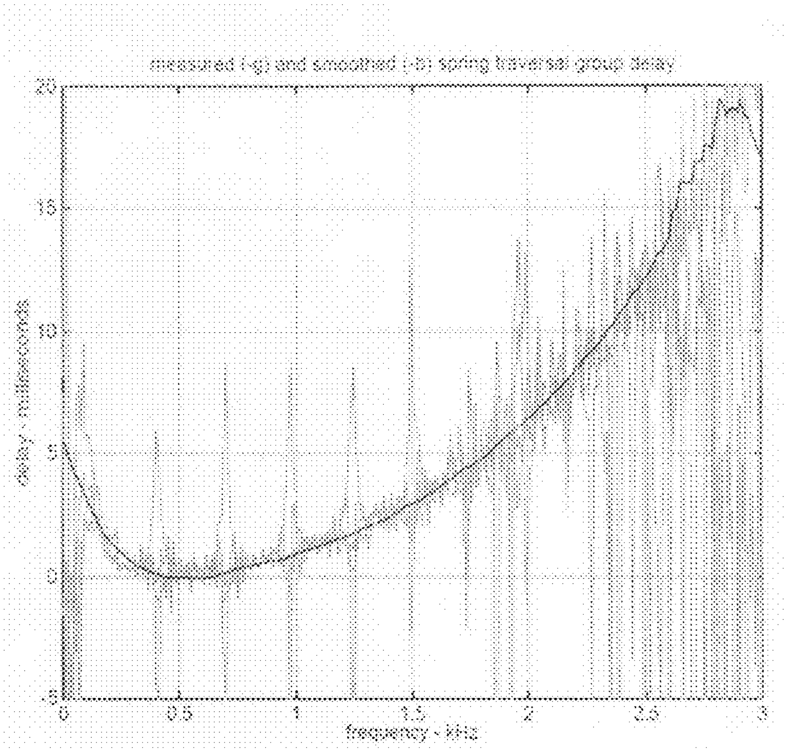
Figure 19:
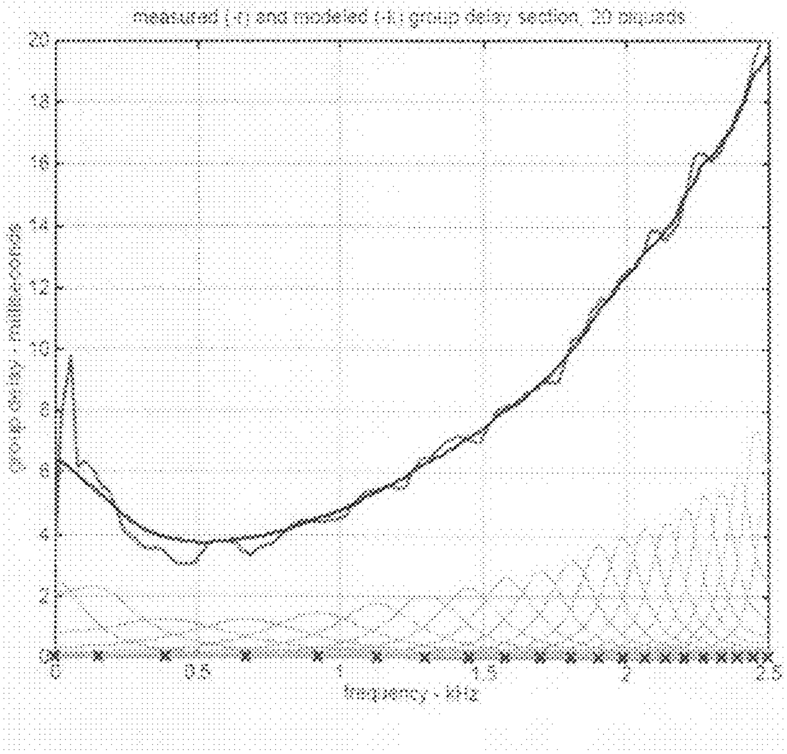

As described above, additional behavior which needs to be modeled according to aspects of the invention is the dispersion associated with the spring. FIG. 18 shows the group delay associated with one round trip through the same spring analyzed in FIGS. 15-17. This plot was generated by finding the group delay associated with each of the arrivals of FIG. 15, with the reflections treated as impulse responses. The group delays for the arrivals are superimposed, after scaling by 1; ⅓; ⅕; . . . to account for the total number of round trips completed by each arrival. These plots show the total (scaled) amount of group delay incurred by one round trip through the spring. An allpass filter matching this group delay, designed as described above, can be used to approximate the dispersion filter D(z) in the waveguide model. FIG. 19 shows the desired group delay, superimposed with the group delay of the allpass filter used to approximate the delay. Note that the delay plotted is mainly the dispersive component of the spring delay, with much of the bulk delay removed and implemented as the delay line in the waveguide model. Also note that the filter A(z) will have some group delay associated with it, and although this delay is small, it has been subtracted from the measured round-trip dispersive delay to find the desired group delay modeled by D(z).

Figure 20A:
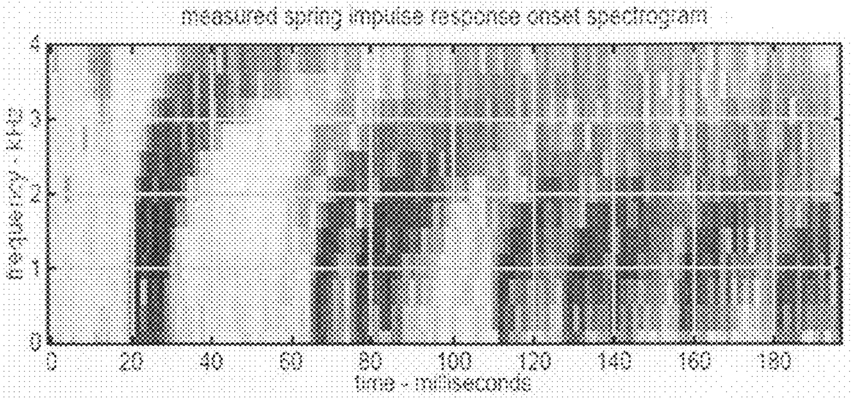
FIGS. 20(*a*) to (*d*) are graphs comparing measured and modeled impulse response spectrograms of the Accutronics Type 8 spring reverberator using certain techniques provided by the present invention.
Figure 20B:
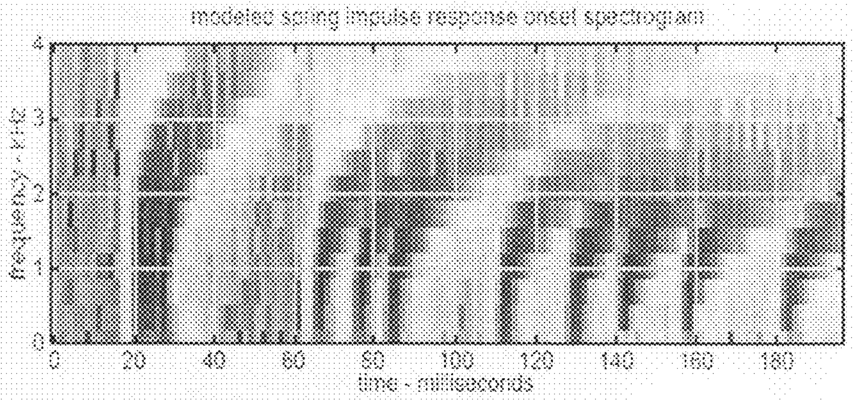
Figures 20C, 20D:
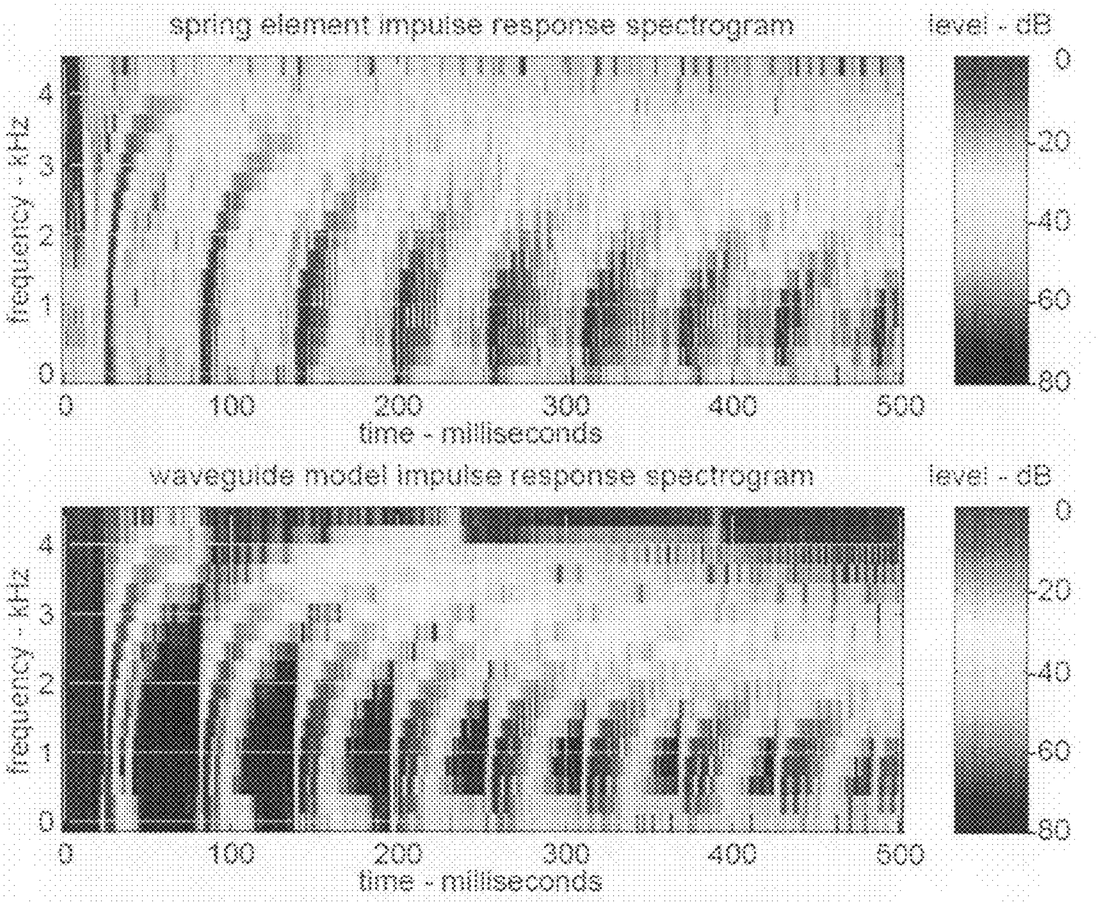

FIG. 20(*a*) shows a spectrogram of the measured Accutronics Type 8 impulse response, and FIG. 20(*b*) is a spectrogram of the model obtained using the techniques of the invention as described above. The three springs in the Accutronics unit produce reflections with similar delays, which spread out and become distinct as more round trips are completed. Listening tests show good perceptual agreement between the measured springs and emulations.

Note that the model spectrogram shown in FIG. 20(*b*) did not include a simulation of the longitudinal mode, and as a result, does not exhibit widening of the arrivals seen in the measured spectrogram in FIG. 20(*a*). FIGS. 20(*c*) and 20(*d*) show measured and modeled spectrograms, respectively, for one of the spring elements comprising the Accutronics Type 8 unit discussed above. In this case, longitudinal mode is simulated using the approach described in reference to FIG. 13. Here, the simulated and measured arrivals exhibit a comparable amount of smearing over time. Again, listening tests show good perceptual agreement between the emulation and the actual spring.

Figure 21:
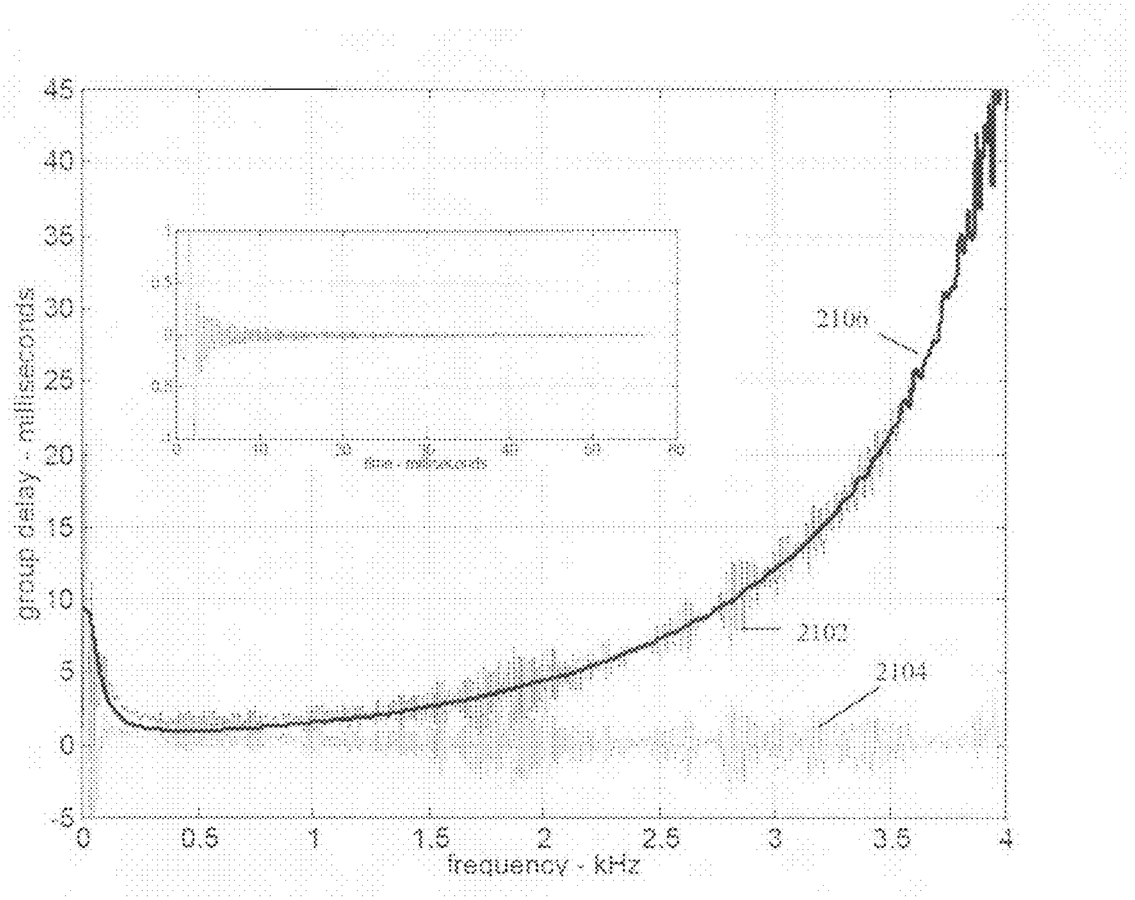
FIGS. 21 and 22(*a*) and (*b*) are graphs illustrating alternative methods of estimating dispersion and attenuation filters for use in the spring reverberation models of the present invention.

It should be noted that a number of other methods may be employed to emulate certain of the desired spring characteristics. For instance, the desired time delay as a function of frequency may be estimated by tracing the first arrival spectrogram peak, as shown in FIG. 4. The attenuation filter may then be found by estimating the reverberation times as a function of frequency, $T_{60}(\omega)$. Taking into account the single-traversal time delay as a function of frequency, the needed per-traversal attenuation may be found. Alternatively, the difference between the measured 2102 and minimum-phase 2104 group delay of the first arrival may be used to obtain the desired time delay 2106 as a function of frequency as seen in FIG. 21. By filtering the measured impulse response with an allpass filter producing a time advance equal to odd integer multiples of the frequency-dependent time delay, the various arrivals will have their energy aligned.

Figure 22A:
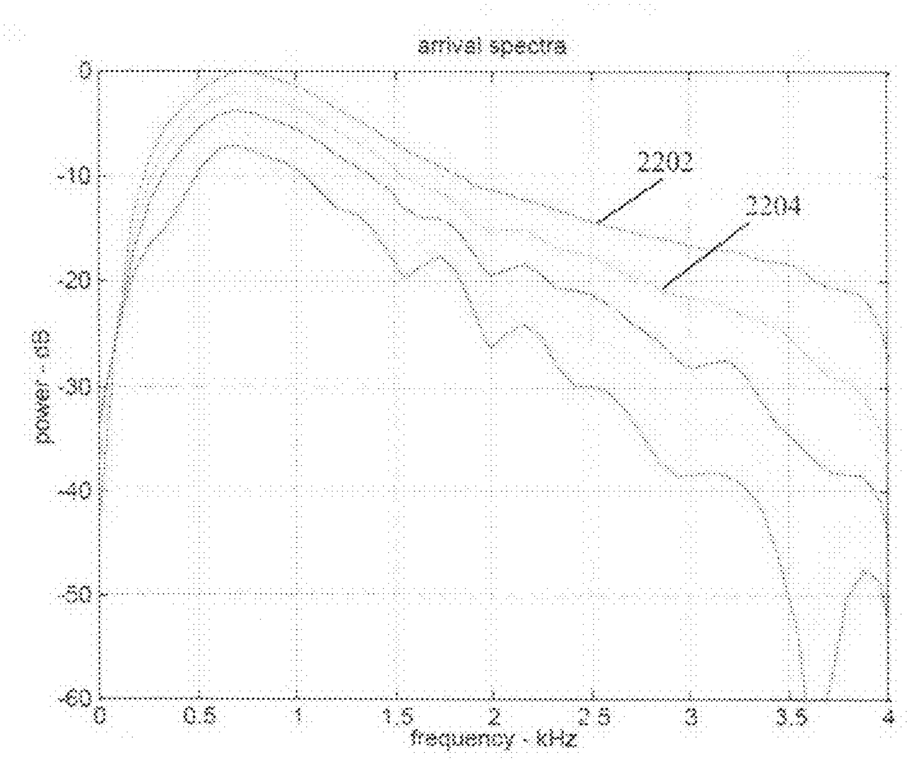
Figure 22B:
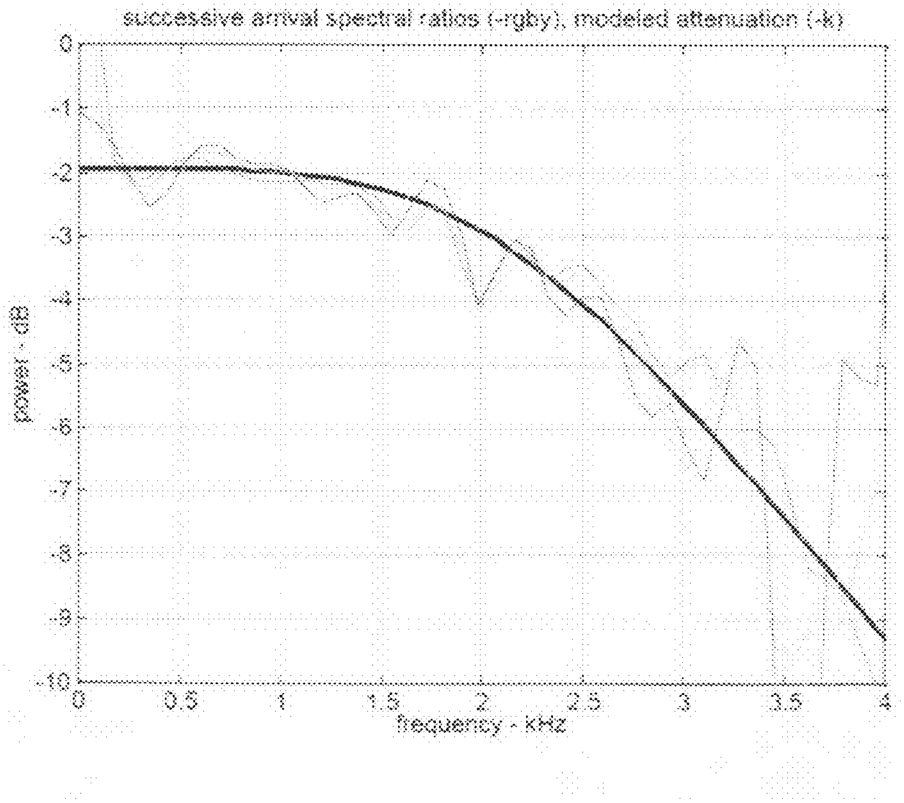

Moreover, by comparing successive arrival spectra 2202, 2204, etc., as shown in FIG. 22(*a*), the needed attenuation may be estimated by fitting a filter to the ratios as shown in FIG. 22(*b*).

The present inventors recognize that a digital emulation of a spring reverberator using the above-described techniques of the present invention, operating as a plug-in in a digital audio workstation, would have many advantages over a physical unit, including repeatability and automation of control parameters. Certain of these aspects of the invention will now be described in connection with FIG. 23.

System 2300 in this example is a computer configured with digital audio workstation (DAW) 2302 software such as Digidesign Pro Tools that supports plugin applications (e.g. AU, VST, RTAS compatible plugins), and possibly having a DSP card (not shown) that accelerates plugin processing. One possible example of a card and corresponding plugin application that can be adapted for use with this invention is UAD-1 DSP card and plugin bundle from Universal Audio of Santa Cruz, Calif. In such an example, the spring reverb emulation techniques of the present invention are included as one plug-in application 2304, or one application 2304 of among many plug-in applications provided with the card. In one example embodiment, system 2300 is a Mac or PC having a processor such as an Intel Pentium or other Intel CPU, AMD Athlon or other AMD CPU, or a Power-compatible CPU.

Figure 23:
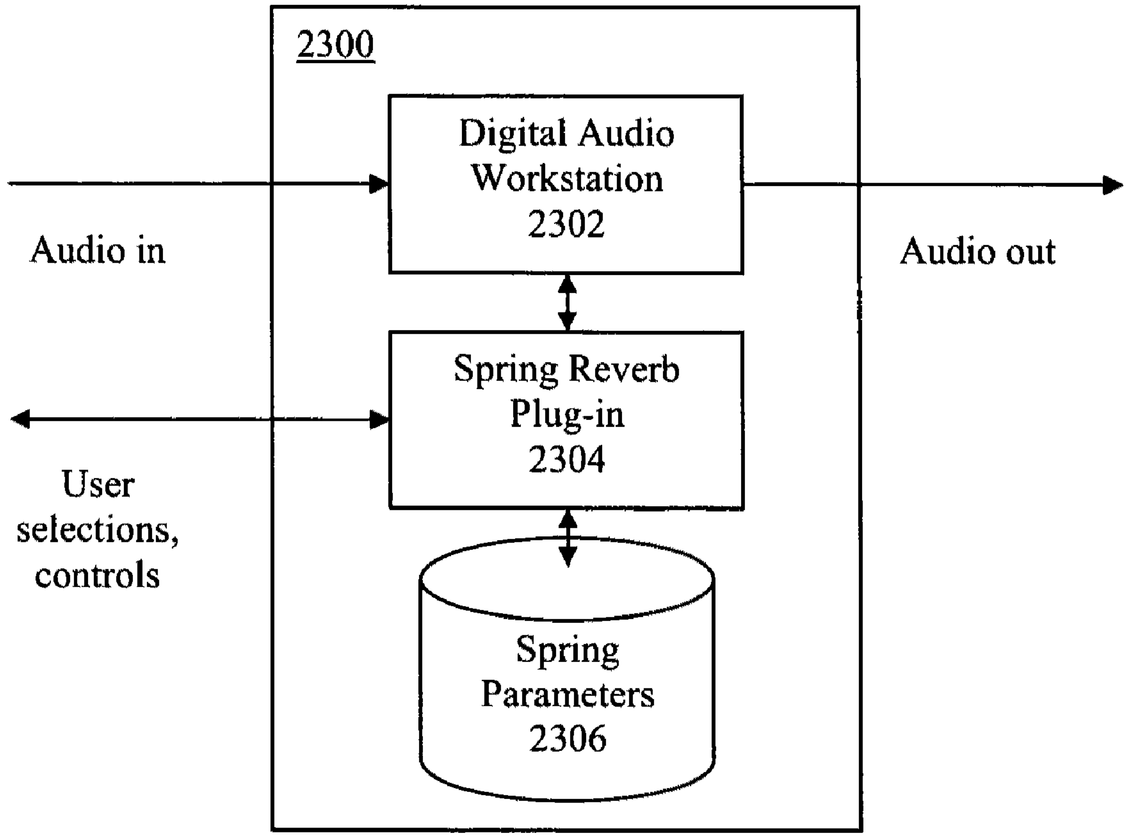
FIG. 23 is a block diagram illustrating an example implementation of the techniques of the present invention in a digital audio workstation.

As further shown in the example implementation of FIG. 23, the plug-in application can use pre-configured spring parameters 2306. These can include, for example, pre-loaded types of emulated mechanical spring reverberators such as the Accutronics Type 8, along with pre-configured parameters for the emulated spring, such as pre-estimated values for the dispersion and attenuation filters, as well as any pure delays, coupling filters and scattering junctions.

Audio (either provided within or to the system 2300 in real-time or via recorded media) can be processed by the DAW 2302 using the plug-in application 2304 and the techniques of the present invention. Plug-in application 2304 can further allow a user, via a user interface such as a graphical display, mouse, keyboard, etc., to select and adjust the parameters 2306 used by the plug-in application 2304, which can further cause the DAW 2302 to process the audio with the desired effect.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method comprising:

identifying more than one propagation modes of a spring;

determining a dispersive delay effect associated with one or more of the identified propagation modes; and digitally modeling the spring to emulate how an input signal is affected by all of the identified propagation modes, wherein modeling includes emulating the determined dispersive delay effect associated with the identified propagation modes.

2. A method according to claim 1, further comprising:

identifying one or more reverberation characteristics of the spring, wherein the digital model accounts for the one or more reverberation characteristics.

3. A method according to claim 2, wherein the digital model includes a waveguide corresponding to a portion of the spring and a plurality of filters that estimate the identified reverberation characteristics.

4. A method according to claim 3, wherein the identified reverberation characteristics include a frequency-dependent dispersion and a frequency-dependent attenuation.

5. A method according to claim 1, further comprising:

estimating how energy from the input signal is coupled between the identified propagation modes.

6. A method according to claim 1, wherein the modeling step includes:

modeling a first waveguide section corresponding to one of the identified propagation modes; and modeling a second waveguide section different from the first waveguide section corresponding to another of the identified propagation modes.

7. A method according to claim 6, wherein the modeling step further includes:

estimating a coupling filter between the first and second waveguide sections.

8. A method according to claim 1, wherein the identified propagation modes include a torsional and a longitudinal mode.

9. A method according to claim 1, wherein the identified propagation modes include a torsional and a transversal mode.

10. A method according to claim 8, further comprising:

receiving a mechanical disturbance that couples energy into the longitudinal mode.

11. A method according to claim 10, further comprising:

receiving mechanical constraints of the spring, wherein the digital model accounts for limits on an amplitude of a longitudinal waveform generated in response to the mechanical disturbance in accordance with the received mechanical constraints.

12. A method according to claim 9, further comprising:

receiving a mechanical disturbance that couples energy into the transversal mode.

13. A method according to claim 12, further comprising:

receiving mechanical constraints of the spring, wherein the digital model accounts for limits on an amplitude of a transversal waveform generated in response to the mechanical disturbance in accordance with the received mechanical constraints.

14. A method according to claim 2, wherein the reverberation characteristic identifying step includes:

measuring a group delay of an impulse input to the spring.

15. A method according to claim 14, wherein the modeling step includes:

estimating a dispersion filter that provides a modeled group delay corresponding to the measured group delay.

16. An apparatus for artificially emulating characteristics of a spring reverberation unit, comprising:

a waveguide that provides an output signal in response to an input signal that is altered in accordance with the emulated characteristics, wherein the emulated characteristics include a determined dispersive delay effect associated with one or more propagation modes of the spring reverberation unit, the waveguide including:

a first waveguide section corresponding to a first identified propagation mode of the spring reverberation unit; and a second waveguide section corresponding to a second different identified propagation mode of the spring reverberation unit.

17. An apparatus according to claim 16, further comprising a coupling filter between the first and second waveguide sections.

18. An apparatus according to claim 16, wherein the waveguide sections include left-going and right-going portions that model waves traveling forward and back, respectively, between opposite ends of the spring reverberation unit.

19. An apparatus according to claim 16, wherein the identified propagation modes include a torsional and a longitudinal mode.

20. An apparatus according to claim 16, wherein the identified propagation modes include a torsional and a transversal mode.

21. An apparatus for artificially emulating characteristics of a spring reverberation unit, comprising:

a waveguide that provides an output signal in response to an input signal that is altered in accordance with the emulated characteristics, wherein the emulated characteristics include a determined dispersive delay effect associated with one or more propagation modes of the spring reverberation unit, the waveguide including elements corresponding to first and second different identified ones of the propagation modes of the spring reverberation unit.

22. An apparatus according to claim 21, wherein the identified propagation modes include a torsional and a longitudinal mode.

23. An apparatus according to claim 21, wherein the identified propagation modes include a torsional and a transversal mode.

24. An apparatus according to claim 21, wherein the waveguide elements include a plurality of filters that estimate the emulated characteristics.

25. An apparatus according to claim 24, wherein the emulated characteristics include a frequency-dependent dispersion and a frequency-dependent attenuation.

26. An apparatus according to claim 25, wherein the waveguide elements further includes a coupling filter that estimates a coupling from the first identified propagation mode into the second identified propagation mode.

* * * * *